(12) United States Patent
Sakakibara (10) Patent No.: US 9,423,817 B2
(45) Date of Patent: Aug. 23, 2016

(54) POWER SOURCE CIRCUIT FOR IDLING-STOP VEHICLES

(71) Applicant: KABUSHIKI KAISHA TOYOTA JIDOSHOKKI, Kariya-shi, Aichi (JP)

(72) Inventor: Norihisa Sakakibara, Kariya (JP)

(73) Assignee: KABUSHIKI KAISHA TOYOTA JIDOSHOKKI, Kariya-shi, Aichi (JP)

( * ) Notice: Subject to any disclaimer, the term of this patent is extended or adjusted under 35 U.S.C. 154(b) by 0 days.

(21) Appl. No.: 14/443,098

(22) PCT Filed: Oct. 21, 2013

(86) PCT No.: PCT/JP2013/078460
§ 371 (c)(1),
(2) Date: May 15, 2015

(87) PCT Pub. No.: WO2014/087750
PCT Pub. Date: Jun. 12, 2014

(65) Prior Publication Data
US 2015/0346758 A1 Dec. 3, 2015

(30) Foreign Application Priority Data

Dec. 5, 2012 (JP) ................................ 2012-265892

(51) Int. Cl.
| | |
|---|---|
| *H02M 3/158* | (2006.01) |
| *G05F 5/00* | (2006.01) |
| *G05F 1/565* | (2006.01) |
| *H02M 1/00* | (2006.01) |
| *G01R 19/00* | (2006.01) |

(52) U.S. Cl.
CPC ................. *G05F 5/00* (2013.01); *H02M 3/158* (2013.01); *G01R 19/0092* (2013.01); *G05F 1/565* (2013.01); *H02M 2001/0009* (2013.01); *H02M 2001/0048* (2013.01); *Y02B 70/1491* (2013.01)

(58) Field of Classification Search
CPC ............ H02M 1/32; H02M 2001/325; H02M 3/1584; G05F 1/40; G05F 5/00
USPC ......... 323/225, 265, 268, 269, 272, 289, 303, 323/901; 363/16, 124
See application file for complete search history.

(56) References Cited

U.S. PATENT DOCUMENTS

| | | | |
|---|---|---|---|
| 2006/0006850 A1* | 1/2006 | Inoue | H02J 7/0065 323/265 |
| 2007/0152641 A1 | 7/2007 | Kusafuka et al. | |

FOREIGN PATENT DOCUMENTS

| | | |
|---|---|---|
| JP | 06-207973 A | 7/1994 |
| JP | 2005-229756 A | 8/2005 |
| JP | 2006-246564 A | 9/2006 |
| JP | 2011-223755 A | 11/2011 |
| JP | 2012-065494 A | 3/2012 |
| WO | 2005/080774 A2 | 9/2005 |

OTHER PUBLICATIONS

Communication dated Aug. 11, 2015 from the Japanese Patent Office in counterpart application No. 2012-265892.
International Search Report for PCT/JP2013/078460 dated Dec. 10, 2013.

* cited by examiner

*Primary Examiner* — Gary L Laxton
*Assistant Examiner* — Jye-June Lee
(74) *Attorney, Agent, or Firm* — Sughrue Mion, PLLC (57) ABSTRACT

A power source circuit for idling-stop vehicles is provided whereby at normal times other than a restarting of an engine after being idling-stopped, a first voltage detected by a current detection circuit when a bypass switch is turned off is acquired, and a second voltage detected by the current detection circuit when the bypass switch is turned on is also acquired, and an electric current flowing from a battery to a load via the bypass switch is obtained on the basis of a difference between the first voltage and the second voltage.

4 Claims, 8 Drawing Sheets

POWER SOURCE CIRCUIT FOR IDLING-STOP VEHICLES

TECHNICAL FIELD

The present invention relates to a power source circuit that maintains a voltage of a battery constant, and outputs the voltage to a load.

BACKGROUND ART

In recent years, idling-stop vehicles have been commercialized in order to reduce the consumption of fuel and exhaust gasses. Idling-stop vehicles are vehicles that automatically stop (idling-stop) an engine upon detection of a stop operation of a vehicle due to a wait for a traffic light or the like, and automatically restart the engine upon detection of a starting operation of the vehicle thereafter.

In such idling-stop vehicles, a voltage of a battery is temporarily decreased because a high electric current flows into a starter motor for starting an engine at the restarting of the engine after being idling-stopped. In association with this, a voltage supplied to a load such as an electronic device and the like, connected to the battery, other than the starter motor is also temporarily decreased. Accordingly, there is a possibility that the supplied voltage will deviate from a voltage range needed for operations, depending on a load, leading to a temporarily abnormal operation. This poses a possibility that an operation not intended by a driver will be performed. For example, a car navigation system or an audio system may be reset, or the audio system may skip.

Accordingly, such idling-stop vehicles are provided with a power source circuit between a battery and a load so that a necessary voltage can be kept supplied to the load even if the voltage of the battery is temporarily decreased.

For example, a power source circuit for boosting and outputting a voltage of a battery to a load by continuously turning off a bypass switch and operating a booster circuit at a restarting of an engine after being idling-stopped, and for outputting the voltage of the battery to the load via the bypass switch by continuously turning on the bypass switch and suspending the booster circuit at normal times other than the restarting of the engine, is proposed as an existing power source circuit (for example, see Patent Document 1).

This makes it possible to maintain a necessary power supplied to the load even when the voltage of the battery is temporarily decreased at the restarting of the engine after being idling-stopped. Moreover, the voltage of the battery is output to the load without being decreased by an element within the booster circuit at normal times other the restarting of the engine after being idling-stopped, whereby it becomes possible to maintain the necessary power supplied to the load.

PRIOR ART DOCUMENT

Patent Document

Patent Document 1: Japanese Laid-open Patent Publication No. 2011-223755

SUMMARY OF THE INVENTION

Problems to be Solved by the Invention

However, if the booster circuit is operated at the restarting of the engine when an electric current equal to or higher than a stipulated current flows into the load due to an increase in the load, this poses a possibility that the booster circuit will operate beyond an ability of the circuit. When the booster circuit operates beyond the ability of the circuit as described above, it is possible for the booster circuit to be suspended by an overcurrent protection function or the like within the booster circuit, and the load may be unable to operate properly on a temporary basis.

Accordingly, a possible solution is, for example, to provide a cost-effective current detection circuit using a shunt resistor in an output stage of a power source circuit or within a booster circuit, and to prohibit the operation of the booster circuit when a current detected by the current detection circuit is equal to or higher than a threshold value.

However, when the current detection circuit is configured by using the shunt resistor, a detection value of the detection circuit results in a value in accordance with voltages at both ends of the shunt resistor, leading to a degradation in the detection accuracy of a current flowing into a load due to fluctuations, caused by a change in an ambient temperature, of the resistance value of the shunt resistor and a characteristic of the detection circuit. Additionally, when the detection accuracy of the current flowing into the load is degraded, the booster circuit operates even though a current equal to or higher than a stipulated current flows into the load. As a result, the booster circuit is suspended by an overcurrent protection function or the like, and the load may be unable to operate properly on a temporary basis.

Therefore, a problem to be solved by the present invention is to provide a power source circuit that can detect a current flowing into a load with high accuracy at a low cost for the purpose of maintaining a stable voltage supplied to the load equipped in an idling-stop vehicle.

Means for Solving the Problem

A power source circuit according to the present invention includes: a booster circuit including a booster switch, a coil provided between a battery and the booster switch, and a diode provided between the coil and a load; a first bypass circuit including a first bypass switch connected to the booster circuit in parallel, and a first current detection circuit for detecting a voltage applied to a first shunt resistor provided between the first bypass switch and the load; and a control unit for acquiring a first detection value detected by the first current detection circuit when the control unit turns off the first bypass switch, for also acquiring a second detection value detected by the first current detection circuit when the control unit turns on the first bypass switch, and for obtaining an electric current flowing from the battery into the load via the first bypass switch on the basis of a difference between the second detection value and the first detection value, at normal times other than a restarting of an engine after being idling-stopped.

As described above, the electric current flowing into the load is obtained on the basis of the voltage applied to the first shunt resistor, whereby the electric current flowing into the load can be obtained with a cost-effective configuration. Moreover, the electric current flowing into the load is obtained on the basis of a difference between the second detection value when the electric current flows into the first shunt resistor and the first detection value when the electric current does not flow into the first shunt resistor, whereby the first and the second detection values that are prevented from being influenced by a temperature change as much as possible can be respectively obtained by acquiring the second detection value immediately after acquiring the first detection value. As a result, the electric current flowing into the load can be detected with a high accuracy.

Additionally, the power source circuit according to the present invention may further include an abnormality determination unit for determining a state of the power source circuit as an abnormal state in a case where the electric current obtained by the control unit is equal to or higher than a threshold value.

Furthermore, the control unit may prohibit an idling-stop when the obtained electric current is equal to or higher than the threshold value.

Still further, the power source circuit according to the present invention further includes a second bypass circuit including a second bypass switch connected to the first bypass circuit in parallel. At normal times other than the restarting of the engine after being idling-stopped, the control unit may acquire the first detection value detected by the first current detection circuit when the control unit turns on the second bypass switch while turning off the first bypass switch, and also may acquire the second detection value detected by the first current detection circuit when the control unit turns off the second bypass switch while turning on the first bypass switch, and may obtain an electric current flowing from the battery into the load via the first bypass switch on the basis of the difference between the second detection value and the first detection value.

As described above, the electric current can be made to flow from the battery into the load via the second bypass switch even when the first bypass switch is turned off so as to acquire the first detection value. Consequently, a loss caused in the power source circuit when the electric current flowing into the load is detected can be reduced by making a loss caused by an ON resistance of the second bypass switch smaller than that caused by driving the diode.

Additionally, the second bypass circuit may further include a second current detection circuit for detecting a voltage applied to a second shunt resistor provided between the second bypass switch and the load, and the control unit may, at normal times other than the restarting of the engine after being idling-stopped, acquire a third detection value detected by the second current detection circuit when the control unit turns on the second bypass switch while turning off the first bypass switch, acquire a fourth detection value detected by the second current detection circuit when the control unit turns off the second bypass switch while turning on the first bypass switch, obtain an electric current flowing from the battery into the load via the second bypass switch on the basis of a difference between the third detection value and the fourth detection value, and determine whether the first current detection circuit or the second current detection circuit is faulty, on the basis of the electric current that is obtained on the basis of the difference between the second detection value and the first detection value, and the electric current that is obtained on the basis of the difference between the third detection value and the fourth detection value.

As described above, detection accuracy of the electric current flowing into the load can be improved by determining whether the first current detection circuit or the second current detection circuit is faulty.

Effects of the Invention

According to the present invention, an electric current flowing into a load can be detected with a high accuracy at a low cost for the purpose of maintaining a stable voltage supplied to the load equipped in an idling-stop vehicle.

EMBODIMENTS FOR CARRYING OUT THE INVENTION

Figure 1:
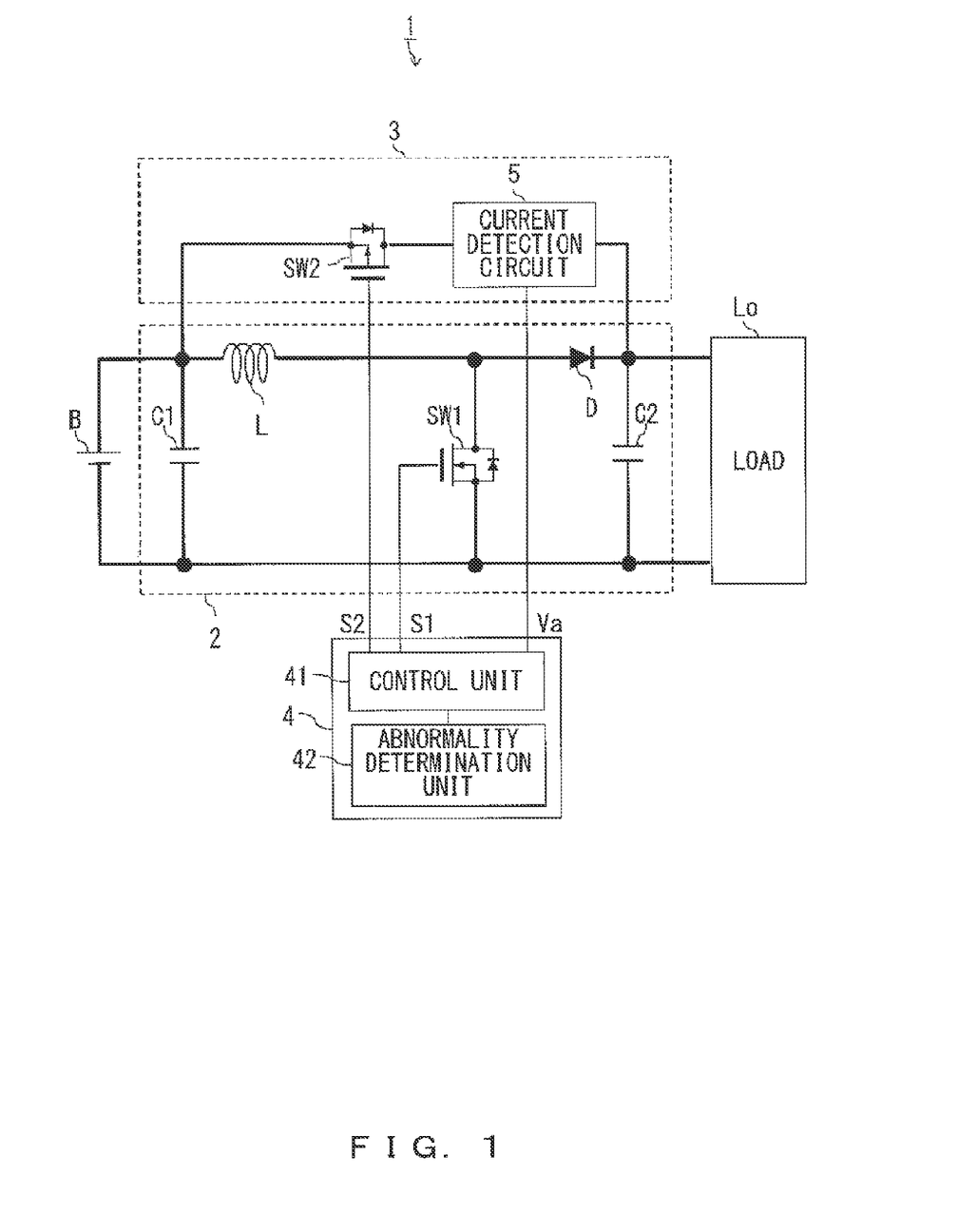
FIG. 1 illustrates a power source circuit according to a first embodiment.

FIG. 1 illustrates a power source circuit according to a first embodiment.

The power source circuit 1 illustrated in FIG. 1 maintains a voltage of a battery B equipped in an idling-stop vehicle constant, and outputs the voltage to a load Lo. The power source circuit 1 includes a booster circuit 2, a bypass circuit 3, and a control circuit 4.

The booster circuit 2 boosts the voltage of the battery B at a restarting of an engine after being idling-stopped, and outputs the voltage to the load Lo. The booster circuit 2 includes a booster switch SW1, a coil L, a diode D, and capacitors C1 and C2.

The booster switch SW1 is, for example, an N-channel MOSFET (Metal Oxide Semiconductor Field Effect Transistor) or the like.

The coil L is provided between the battery B and the booster switch SW1.

The diode D is provided between the coil L and the load Lo.

The capacitor C1 is provided in an input stage of the booster circuit 2.

The capacitor C2 is provided in an output stage of the booster circuit 2.

The bypass circuit 3 includes a bypass switch SW2 (first bypass switch) and a current detection circuit 5 (first current detection circuit).

The bypass switch SW2 is, for example, a P-channel MOSFET, an electromagnetic relay, or the like, and is connected to the booster circuit 2 in parallel.

The current detection circuit 5 shifts a level of a voltage applied to a shunt resistor provided between the bypass switch SW2 and the load Lo to a voltage Va based on a ground of the control circuit 4 or the current detection circuit 5, and outputs the shifted voltage.

The control circuit 4 includes a control unit 41 and an abnormality determination unit 42. Note that the control circuit 4 may be provided within the booster circuit 2.

The control unit 41 outputs control signals S1 and S2 on the basis of various types of notifications transmitted from a higher-level control circuit that controls operations of the entire idling-stop vehicle.

Additionally, the control unit 41 is implemented, for example, with software or hardware. When the control unit 41 is implemented with software, it includes a CPU and a memory. The CPU reads and executes a program stored in the memory, so that the control unit 41 is implemented.

At normal times other than a restarting of an engine after being idling-stopped, the control unit 41 outputs the control signal S1 that continuously turns off the booster switch SW1, and also outputs the control signal S2 that continuously turns on the bypass switch SW2. As a result, the battery B and the load Lo are electrically connected via the bypass switch SW2, and the booster circuit 2 does not perform a booster operation for the voltage of the battery B. Therefore, an electric current flows from the battery B into the load Lo not via the booster circuit 2 but via the bypass circuit 3. Accordingly, a decrease in the voltage caused by the bypass switch SW2 is made smaller than that of the voltage of the battery B caused by the coil L, the diode D or the like, whereby it becomes possible to maintain a necessary voltage supplied to the load Lo at normal times other than the restarting of the engine after being idling-stopped.

Additionally, at the restarting of the engine after being idling-stopped, the control unit 41 outputs the control signal S1 that repeatedly turns on and off the booster switch SW1, and also outputs the control signal S2 that continuously turns off the bypass switch SW2. As a result, the electric connection between the battery B and the load Lo via the bypass switch SW2 is disconnected, and the booster circuit 2 performs a booster operation for the voltage of the battery B, so that the voltage of the battery B is boosted and output to the load Lo. Namely, it becomes possible to maintain a necessary voltage supplied to the load Lo even though the voltage of the battery B is temporarily decreased by driving the starter motor at the restarting of the engine after being idling-stopped.

Furthermore, at normal times other than the restarting of the engine after being idling-stopped, the control unit 41 acquires a voltage Va1 (first detection value) detected by the current detection circuit 5 when the bypass switch SW2 is turned off, and also acquires a voltage Va2 (second detection value) detected by the current detection circuit 5 when the bypass switch SW2 is turned on, and obtains an electric current flowing from the battery B into the load Lo via the bypass switch SW2 on the basis of a difference between the voltage Va2 and the voltage Va1.

The abnormality determination unit 42 determines a state of the power source circuit to be an abnormal state where an overcurrent exceeding a stipulated value flows from the battery B into the load Lo via the bypass circuit 3 when the bypass switch SW2 is turned on in a case where the current obtained by the control unit 41 is equal to or higher than a threshold value, and notifies the control unit 41 that the abnormal state has been determined. The control unit 41 prohibits the operations of the booster circuit 2 upon receipt of the notification reporting that the abnormal state has been determined. Moreover, when the abnormality determination unit 42 determines the above-described abnormal state, it notifies a higher-level control circuit that the abnormal state has been determined. Upon receipt of the notification reporting that the abnormal state has been determined, the higher-level control circuit makes visible on a display (not illustrated) a message indicating that the overcurrent is flowing into the load Lo, or outputs from a speaker (not illustrated) a voice warning that the overcurrent is flowing into the load Lo.

Additionally, the abnormality determination unit 42 is implemented, for example, with software or hardware. When the abnormality determination unit 42 is implemented with software, it includes a CPU and a memory. The CPU reads and executes a program stored in the memory, so that the abnormality determination unit 42 is implemented. Note that the abnormality determination unit 42 may be implemented with one piece of software or hardware along with the control unit 41.

Figure 2:
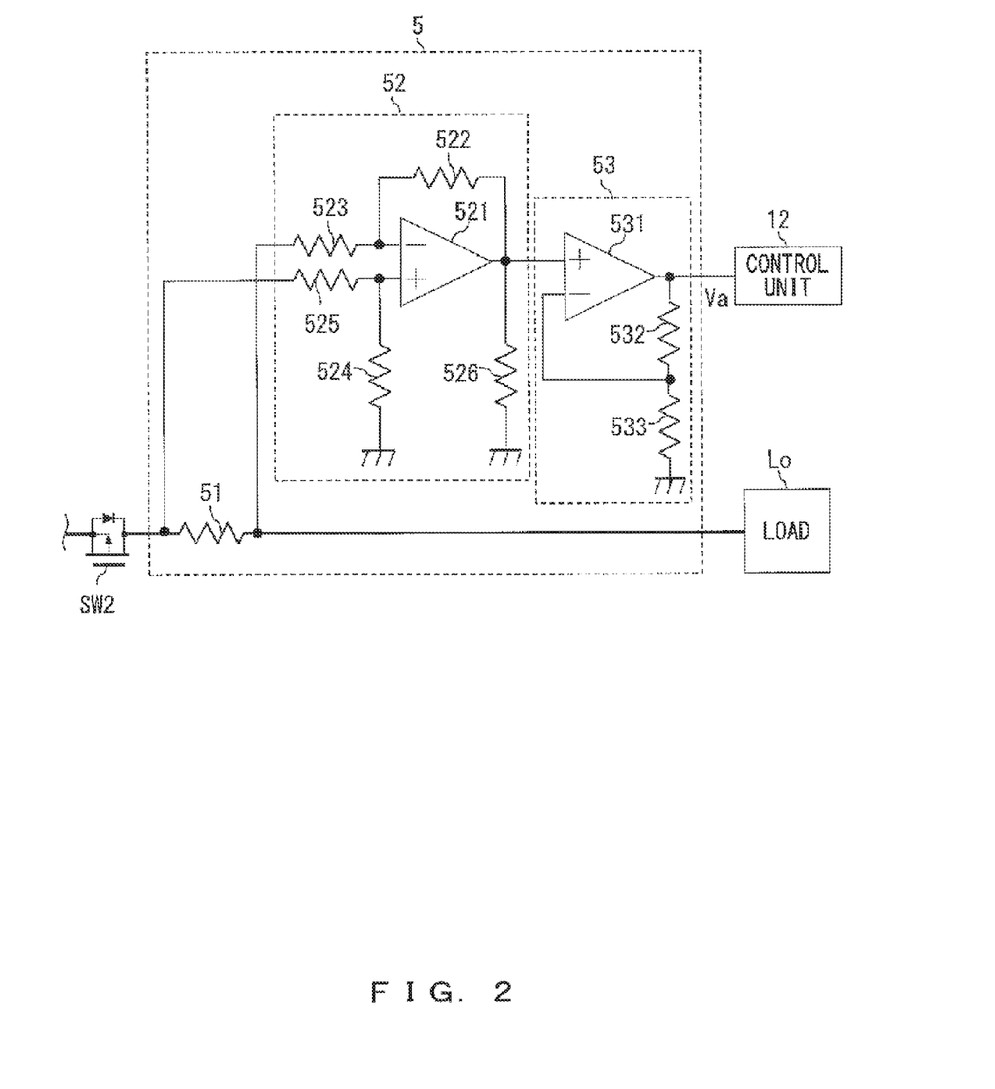
FIG. 2 illustrates an example of a current detection circuit.

FIG. 2 illustrates an example of the current detection circuit 5.

The current detection circuit 5 illustrated in FIG. 2 includes a shunt resistor 51, a differential level shift circuit 52, and an amplification circuit 53.

The shunt resistor 51 is provided between the bypass switch SW2 and the load Lo.

The differential level shift circuit 52 includes an OP amplifier 521, and resistors 522 to 526. The differential level shift circuit 52 multiplies a voltage applied to the shunt resistor 51 by (a resistance value of the resistor 522/a resistance value of the resistor 523) with the OP amplifier 521, and outputs the voltage. The resistance value of the resistor 524 is set to a value equal to that of the resistor 522, whereas the resistance value of the resistor 525 is set to a value equal to that of the resistor 523. Thus, the level of the voltage applied to the shunt resistor 51 can be shifted to a voltage based on the ground of the current detection circuit 5, and the shifted voltage can be output.

The amplification circuit 53 includes an OP amplifier 531, and resistors 532 and 533. The amplification circuit 53 multiplies the voltage output from the differential level shift circuit 52 by (a resistance value of the resistor 532/a resistance value of the resistor 533) with the OP amplifier 531, and outputs the shifted voltage as the voltage Va.

Figure 3:
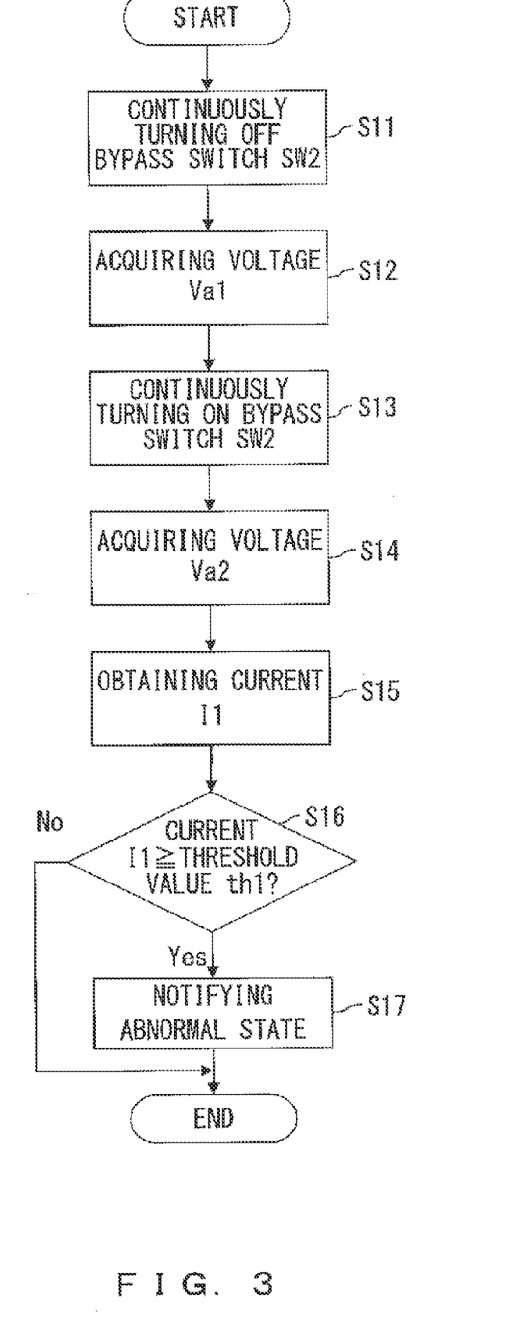
FIG. 3 is a flowchart for explaining operations of a control circuit according to the first embodiment.

FIG. 3 is a flowchart for explaining abnormality determination operations of the control circuit 4 according to the first embodiment.

Initially, the control unit 41 of the control circuit 4 continuously turns off the bypass switch SW2 for a certain length of time (such as 20 [ms]) at a timing (such as every 5 [s]) for determining an abnormal state where an overcurrent flows into the load Lo, at normal times other than the restart time of an engine after being idling-stopped (S11). Moreover, the control unit 41 acquires the voltage Va detected by the current detection circuit 5 as a voltage Va1 when the control unit 41 continuously turns off the bypass switch SW2 for the certain length of time (S12).

Figure 4:
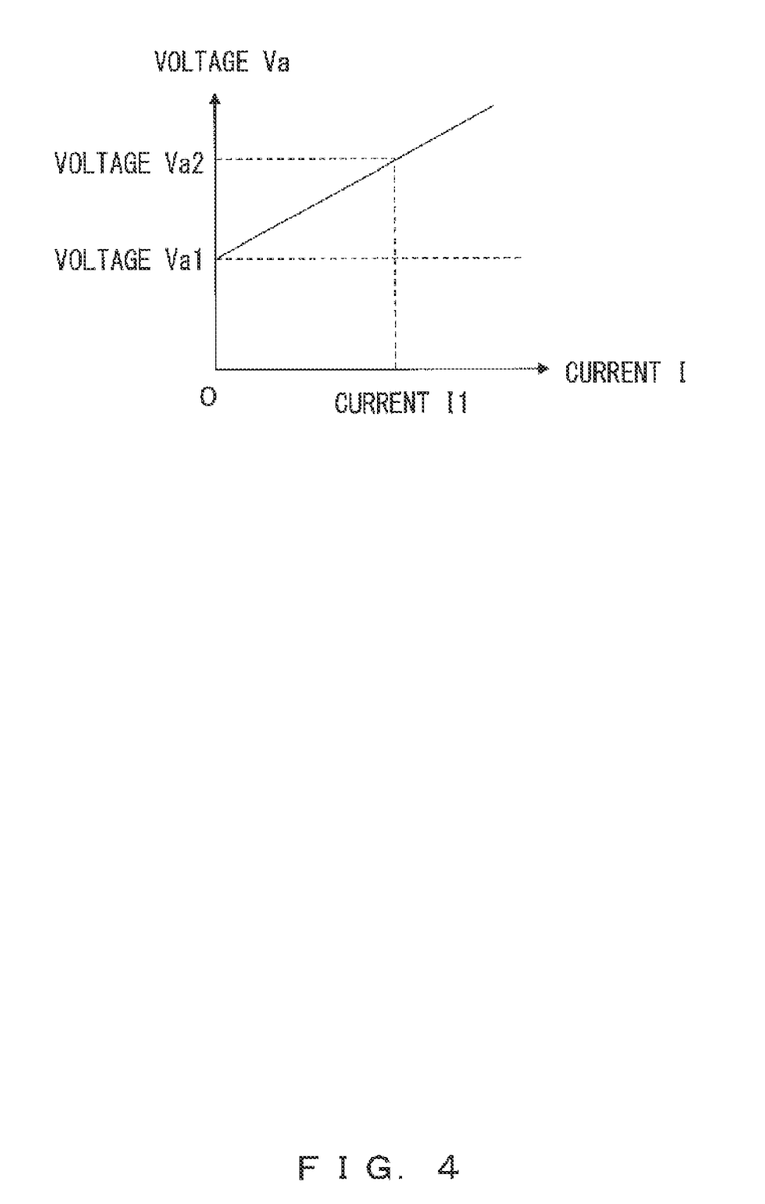
FIG. 4 illustrates a relationship between a voltage Va and a current I.

Next, the control unit 41 acquires the voltage Va detected by the current detection circuit 5 by continuously turning on the bypass switch SW2 (S13) as a voltage Va2 (S14), and obtains a current I1 flowing from the battery B into the load Lo via the bypass switch SW2 on the basis of a difference between the voltage Va2 and the voltage Va1 (S15). For example, the control unit 41 obtains the current I1 by dividing the difference between the voltage Va2 and the voltage Va1 by the resistance value of the shunt resistor 51. The voltage Va1 is assumed to be output from the current detection circuit 5 so that the voltage Va1 becomes higher than 0[V] as represented by a relationship, illustrated in FIG. 4, between the voltage Va and the current I1.

Then, the abnormality determination unit 42 of the control circuit 4 determines a state of the power source circuit to be the abnormal state where the overcurrent flows into the load Lo when the bypass switch SW2 is turned on in a case where the current I1 obtained by the control unit 41 is equal to or higher than the threshold value th1 ("YES" in S16), and notifies the control unit 41 that the abnormal state has been determined (S17).

As described above, with the power source circuit 1 according to the first embodiment, the current I1 flowing into the load Lo is obtained on the basis of the voltage applied to the shunt resistor 51, whereby the current I1 flowing into the load Lo can be obtained with a cost-effective configuration.

Moreover, the current I1 flowing into the load Lo is obtained on the basis of the difference between the voltage Va2 applied when the current flows into the shunt resistor 51 and the voltage Va1 applied when the current does not flow into the shunt resistor 51. Therefore, the voltages Va1 and Va2 that are prevented as much as possible from being influenced by a temperature change can be obtained by acquiring the voltage Va2 immediately after the voltage Va1 is acquired. Consequently, the current I1 flowing into the load Lo can be detected with a high accuracy.

Figure 5:
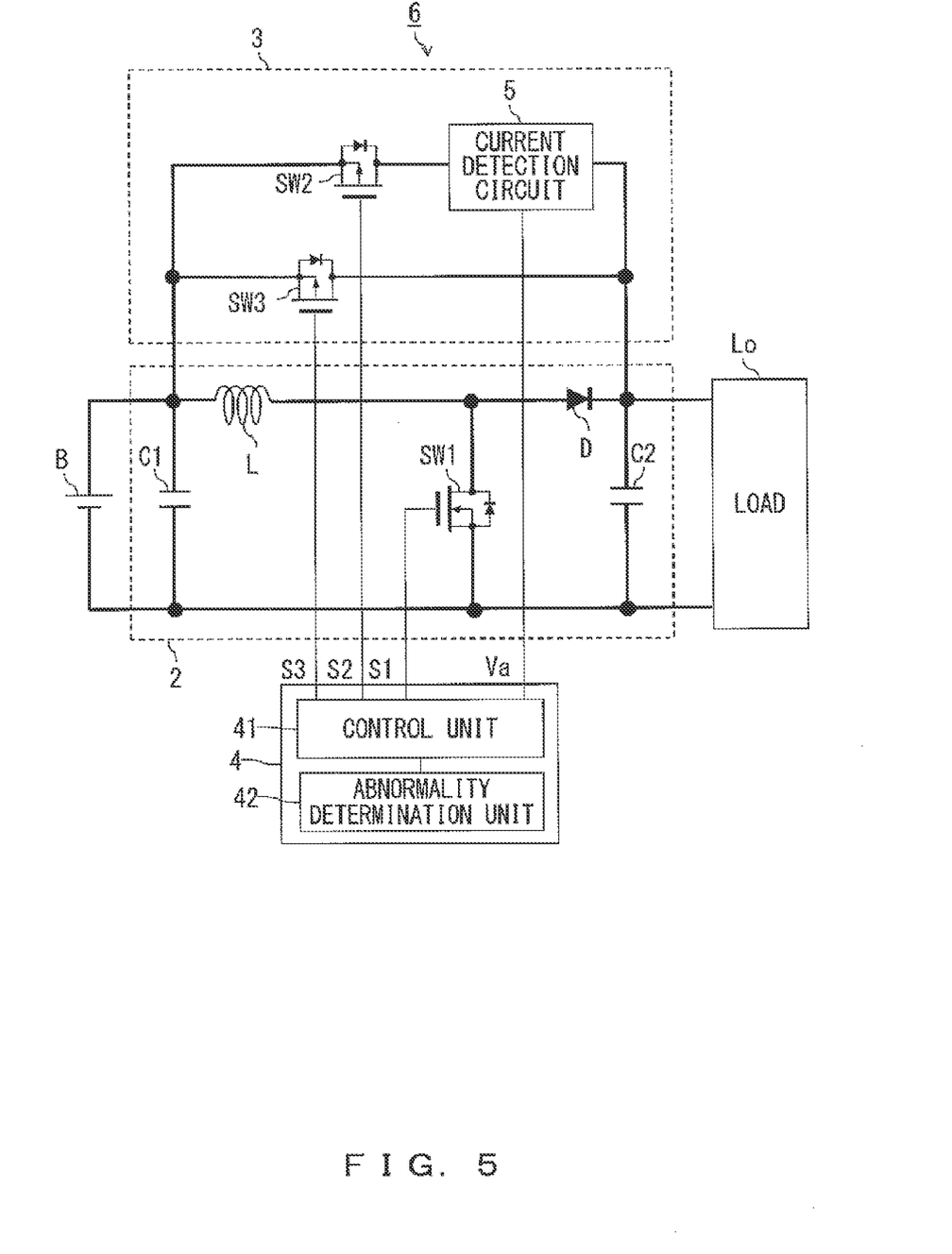
FIG. 5 illustrates a power source circuit according to a second embodiment.

FIG. 5 illustrates a power source circuit according to a second embodiment. The same components as those illustrated in FIG. 1 are denoted with the same reference numerals, and explanations of the components are omitted.

Similarly to the power source circuit 1 illustrated in FIG. 1, the power source circuit 6 illustrated in FIG. 5 maintains the voltage of the battery B equipped in an idling-stop vehicle constant, and outputs the voltage to the load Lo. The power source circuit 6 includes the booster circuit 2, the bypass circuit 3, and the control circuit 4.

The bypass circuit 3 includes the bypass switch SW2 (first bypass switch), a bypass switch SW3 (second bypass switch), and the current detection circuit 5 (first current detection circuit).

The bypass switch SW3 is, for example, a P-channel MOSFET, an electromagnetic relay, or the like, and is connected to the bypass switch SW2 in parallel.

The control unit 41 of the control circuit 4 outputs control signals S1 to S3 on the basis of various types of notifications transmitted from a higher-level control circuit that controls operations of the entire idling-stop vehicle.

At normal times other than the restarting of an engine after being idling-stopped, the control unit 41 outputs the control signal S1 that continuously turns off the booster switch SW1, and also outputs control signals S2 and S3 that continuously turn on both of the bypass switches SW2 and SW3. As a result, the battery B and the load Lo are electrically connected via the bypass switches SW2 and SW3, and the booster circuit 2 does not perform a booster operation for the voltage of the battery B. Therefore, an electric current flows from the battery B into the load Lo not via the booster circuit 2 but via the bypass circuit 3. Accordingly, a decrease in the voltage of the battery B caused by the bypass switches SW2 and SW3 is made smaller than that of the voltage of the battery B caused by the coil L, the diode D or the like, whereby it becomes possible to maintain a necessary voltage supplied to the load Lo at normal times other than the restarting of the engine after being idling-stopped.

Additionally, at the restarting of the engine after being idling-stopped, the control unit 41 outputs the control signal S1 that repeatedly turns on and off the booster switch SW1, and also outputs the control signals S2 and S3 that continuously turn off both of the bypass switches SW2 and SW3. As a result, the electric connection between the battery B and the load Lo via the bypass switches SW2 and SW3 is disconnected, and the booster circuit 2 performs a booster operation for the voltage of the battery B. Consequently, the voltage of the battery B is boosted and output to the load Lo. Namely, it becomes possible to maintain a necessary voltage supplied to the load Lo even though the voltage of the battery B is temporarily decreased by driving the starter motor at the restarting of the engine after being idling-stopped.

Furthermore, at normal times other than the restarting of the engine after being idling-stopped, the control unit 41 acquires the voltage Va1 (first detection value) detected by the current detection circuit 5 when the control unit 41 continuously turns on the bypass switch SW3 while continuously turning off the bypass switch SW2, and also acquires the voltage Va2 (second detection value) detected by the current detection circuit 5 when the control unit 41 continuously turns off the bypass switch SW3 while continuously turning on the bypass switch SW2, and obtains a current flowing from the battery B to the load Lo via the bypass switch SW2 on the basis of a difference between the voltage Va2 and the voltage Va1. Assume that the current flows from the battery B to the load Lo via the bypass switch SW3 when the bypass switch SW3 is continuously turned on while the bypass switch SW2 is continuously turned off. Also assume that the current does not flow from the battery B to the load Lo via the booster circuit 2 at this time. Thus, it becomes possible to make the current flow from the battery B into the load Lo via the bypass switch SW3 for the purpose of acquiring the voltage Va1 even though the bypass switch SW2 is turned off. Therefore, a loss caused by the resistance of the bypass switch SW3 when being turned on is made smaller than that caused by driving the diode D, whereby it becomes possible to reduce a loss caused in the power source circuit 6 when the current I1 flowing into the load Lo is detected.

Figure 6:
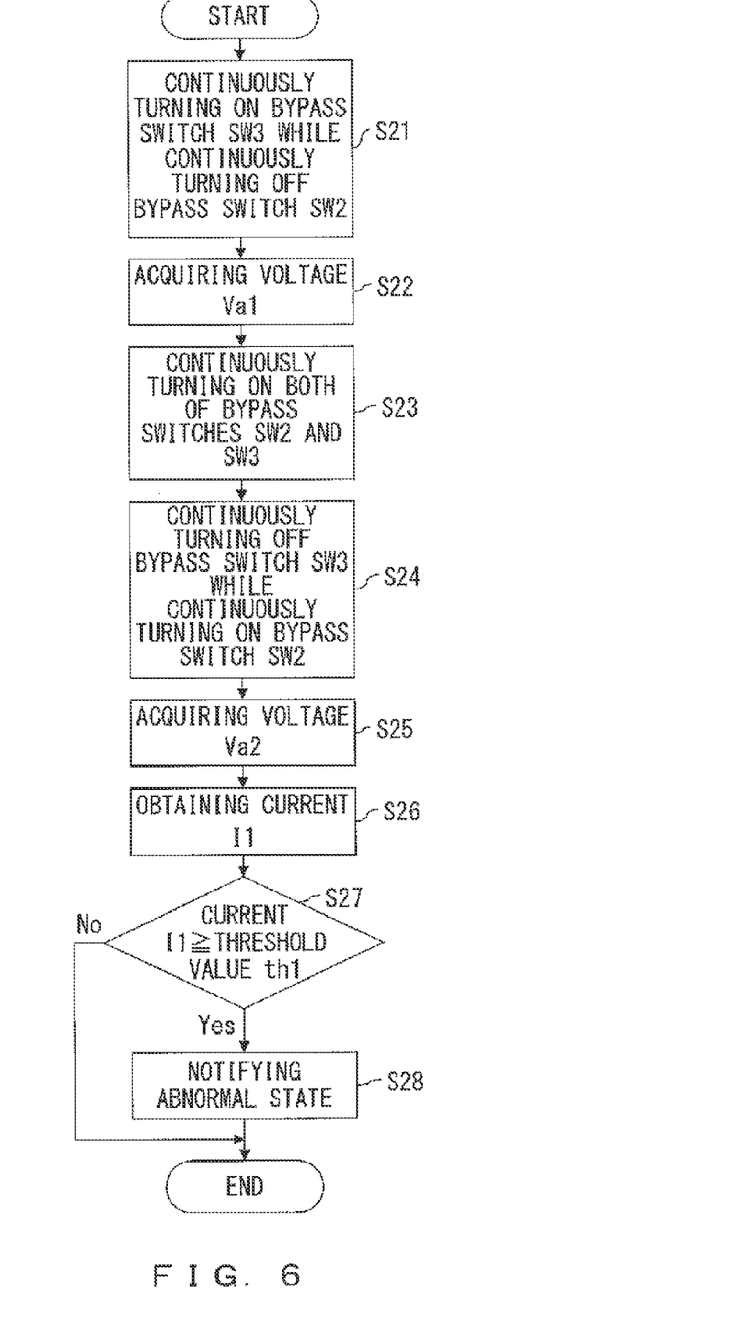
FIG. 6 is a flowchart for explaining operations of a control circuit according to the second embodiment.

FIG. 6 is a flowchart for explaining abnormality determination operations of the control circuit 4 according to the second embodiment.

Initially, at normal times other than the restarting of the engine after being idling-stopped, the control unit 41 of the control circuit 4 continuously turns on the bypass switch SW3 while continuously turning off the bypass switch SW2 for a certain length of time (such as 20 [ms]) at a timing (such as every 5 [s]) for determining an abnormal state where an overcurrent flows into the load Lo (S21). Moreover, the control unit 41 acquires the voltage Va detected by the current detection circuit 5 as the voltage Va1 when the control unit continuously turns on the bypass switch SW3 while continuously turning off the bypass switch SW2 for a certain length of time (S22).

Next, the control unit 41 continuously turns on both of the bypass switches SW2 and SW3 for a certain length of time (such as 2 [ms]) (S23).

Then, the control unit 41 turns off the bypass switch SW3 while continuously turning on the bypass switch SW2 for a certain length of time (such as 20 [ms]) (S24), acquires the voltage Va detected by the current detection circuit 5 as the voltage Va2 (S25), and obtains the current I1 flowing from the battery B into the load Lo via the bypass switch SW2 on the basis of a difference between the voltage Va2 and the voltage Va1 (S26). For example, the control unit 41 obtains the current I1 by dividing the difference between the voltage Va2 and the voltage Va1 by the resistance value of the shunt resistor 51.

Next, the abnormality determination unit 42 of the control circuit 4 determines a state of the power source circuit to be an abnormal state where an overcurrent flows into the load Lo when the bypass switch SW2 is turned on in a case where the current I1 obtained by the control unit 41 is equal to or higher than the threshold value th1 ("YES" in S27), and notifies the control unit 41 that the abnormal state has been determined (S28).

Figure 7:
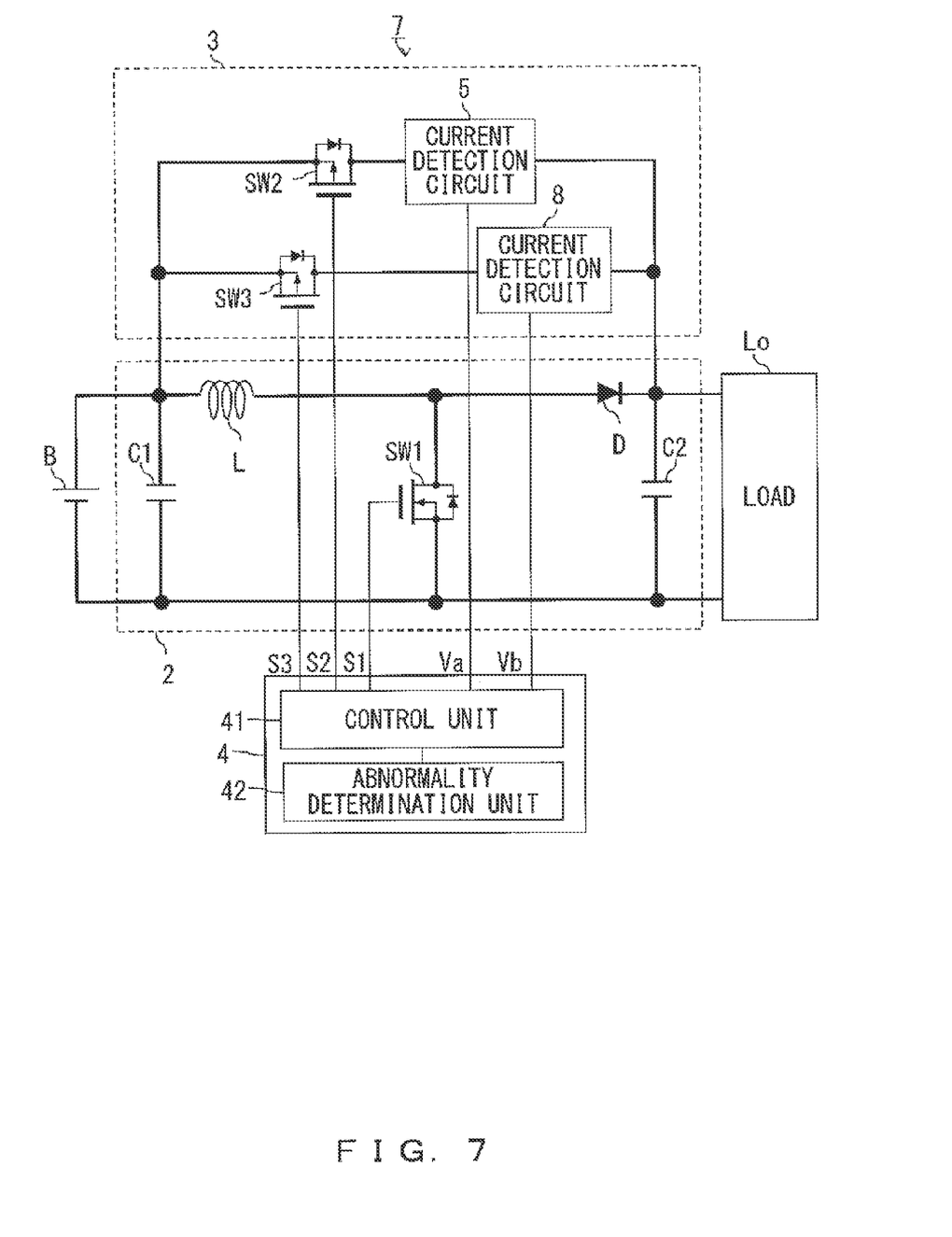
FIG. 7 illustrates a power source circuit according to a third embodiment.

As described above, with the power source circuit 6 according to the second embodiment, the current I1 flowing into the load Lo is obtained on the basis of the voltage applied to the shunt resistor 51 similarly to the power source circuit 1 according to the first embodiment. Accordingly, the current I1 flowing into the load Lo can be obtained with a cost-effective configuration. Moreover, the current I1 flowing into the load Lo is obtained on the basis of the difference between the voltage Va2 applied when the current flows into the shunt resistor 51 and the voltage Va1 applied when the current does not flow into the shunt resistor 51. Therefore, the voltages Va1 and Va2 that are prevented as much as possible from being influenced by a temperature change can be respectively obtained by acquiring the voltage Va2 immediately after the voltage Va1 is acquired. Consequently, the current I1 flowing into the load Lo can be detected with a high accuracy, FIG. 7 illustrates a power source circuit according to a third embodiment. The same components as those illustrated in FIG. 5 are denoted with the same reference numerals, and explanations of the components are omitted.

Similarly to the power source circuit 6 illustrated in FIG. 5, the power source circuit 7 illustrated in FIG. 7 maintains the voltage of the battery B equipped in an idling-stop vehicle constant, and outputs the voltage to the load Lo. The power source circuit 7 includes the booster circuit 2, the bypass circuit 3, and the control circuit 4.

The bypass circuit 3 includes the bypass switch SW2 (first bypass switch), the bypass switch SW3 (second bypass switch), the current detection circuit 5 (first current detection circuit), and a current detection circuit 8 (second current detection circuit).

The current detection circuit 8 shifts a level of the voltage applied to the shunt resistor provided between the bypass switch SW3 and the load Lo to the voltage Vb based on the ground of the control circuit 4 or the current detection circuit 5, and outputs the shifted voltage. A configuration of the current detection circuit 8 is assumed to be the same as, for example, that of the current detection circuit 5 illustrated in FIG. 2.

Additionally, at normal times other than the restart time of an engine after being idling-stopped, the control unit 41 acquires the voltage Va1 (first detection value) detected by the current detection circuit 5 when the control unit 41 continuously turns on the bypass switch SW3 while continuously turning off the bypass switch SW2, and also acquires the voltage Vb1 (third detection value) detected by the current detection circuit 8. Moreover, the control unit 41 acquires the voltage Va2 (second detection value) detected by the current detection circuit 5 when the control unit 41 continuously turns off the bypass switch SW3 while continuously turning on the bypass switch SW2, and also acquire the voltage Vb2 (fourth detection value) detected by the current detection circuit 8. Moreover, the control unit 41 obtains the current I1 flowing from the battery B into the load Lo via the bypass switch SW2 on the basis of a difference between the voltage Va2 and the voltage Va1, and also obtains the current I2 flowing from the battery B to the load Lo via the bypass switch SW3 on the basis of a difference between the voltage Vb1 and the voltage Vb2.

Additionally, the control unit 41 determines whether the current detection circuit 5 or the current detection circuit 8 is faulty on the basis of the current I1 or the current I2. When the current detection circuit 5 or the current detection circuit 8 is faulty, the control unit 41 notifies the higher-level control circuit that the current detection circuit 5 or the current detection circuit 8 is faulty. Upon receipt of the notification reporting that the current detection circuit 5 or the current detection circuit 8 is faulty, the higher-level control circuit makes visible on a display (not illustrated) a message indicating that the current detection circuit 5 or the current detection circuit 8 is faulty, or outputs from a speaker (not illustrated) a voice warning that the current detection circuit 5 or the current detection circuit 8 is faulty. As described above, the detection accuracy of the currents I1 and I2 that flow into the load Lo can be improved by determining whether the current detection circuit 5 or the current detection circuit 8 is faulty.

Figure 8:
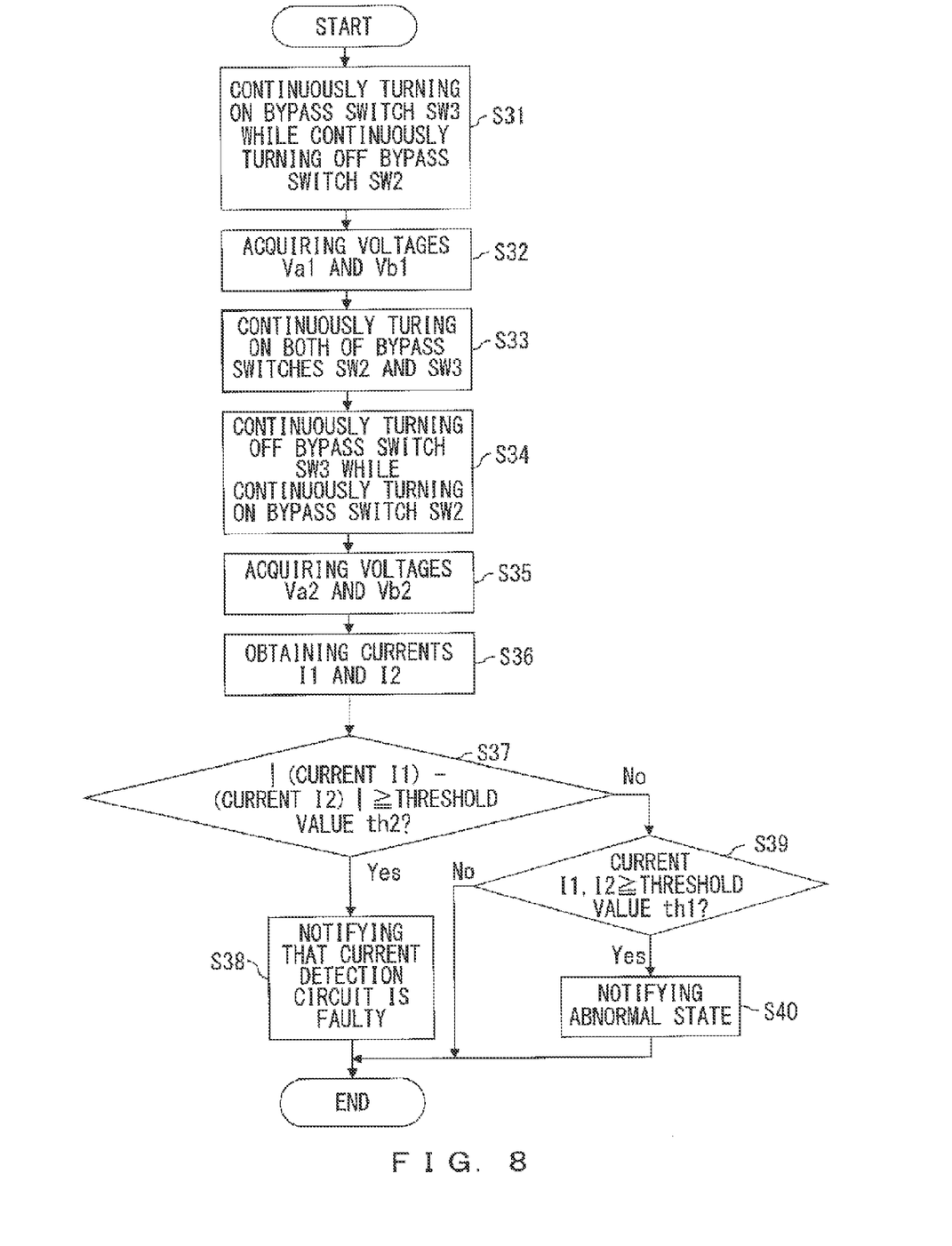
FIG. 8 is a flowchart for explaining operations of a control circuit according to the third embodiment.

FIG. 8 is a flowchart for explaining abnormality determination operations of the control circuit 4 according to the third embodiment.

Initially, the control unit 41 of the control circuit 4 continuously turns on the bypass switch SW3 while continuously turning off the bypass switch SW2 for a certain length of time (such as 20 [ms]) at a timing (such as every 5 [s]) for determining an abnormal state where an overcurrent flows into the load Lo, at normal times other than the restart time of an engine after being idling-stopped (S31). Moreover, the control unit 41 acquires the voltage Va detected by the current detection circuit 5 as the voltage Va1 when the control unit 41 continuously turns on the bypass switch SW3 while continuously turning off the bypass switch SW2 for a certain length of time, and also acquires the voltage Vb detected by the current detection circuit 8 as the voltage Vb1 (S32).

Next, the control unit 41 continuously turns on both of the bypass switches SW2 and SW3 for a certain length of time (such as 2 [ms]) (S33).

Then, the control unit 41 turns off the bypass switch SW3 while continuously turning on the bypass switch SW2 for a certain length of time (such as 20 [ms]) (S34), acquires the voltage Va detected by the current detection circuit 5 as the voltage Va2, and also acquires the voltage Vb detected by the current detection circuit 8 as the voltage Vb2 (S35).

Next, the control unit 41 obtains the current I1 flowing from the battery B into the load Lo via the bypass switch SW2 on the basis of a difference between the voltage Va2 and the voltage Va1, and also obtains the current I2 flowing from the battery B into the load Lo via the bypass switch SW3 on the basis of a difference between the voltage Vb1 and the voltage Vb2 (S36). For example, the control unit 41 obtains the current I1 by dividing the difference between the voltage Va2 and the voltage Va1 by the resistance value of the shunt resistor 51, and also obtains the current I2 by dividing the difference between the voltage Vb1 and the voltage Vb2 by the resistance value of the shunt resistor 51.

Then, when an absolute value of the difference between the current I1 and the current I2 is equal to or larger than a threshold value th2, namely, when the control unit 41 determines that the current detection circuit 5 or the current detection circuit 8 is faulty ("YES" in S37), the control unit 41 notifies the higher-level control circuit that the current detection circuit 5 or the current detection circuit 8 is faulty (S38).

Alternatively, the abnormality determination unit 42 of the control circuit 4 determines the state of the power source circuit to be the abnormal state where the overcurrent flows into the load Lo when the bypass switches SW2 and SW3 are turned on in a case where the absolute value of the difference between the current I1 and the current I2 is smaller than the threshold value th2 ("NO" in S37) and both of the current I1 and the current I2 are equal to or higher than the threshold value th1 ("YES" in S39), and notifies the control unit 41 that the abnormal state has been determined (S40).

As described above, with the power source circuit 7 according to the third embodiment, the current I1 flowing into the load Lo is obtained on the basis of the voltage applied to the shunt resistor 51 similarly to the power source circuit 1 according to the first embodiment. Therefore, the current I1 flowing into the load Lo can be obtained with a cost-effective configuration. Moreover, the current I1 (or the current I2) flowing into the load Lo is obtained on the basis of the difference between the voltage Va2 (or the voltage Vb1) applied when the current flows into the shunt resistor 51 and the voltage Va1 (or the voltage Vb2) applied when the current does not flow into the shunt resistor 51. Therefore, the voltages Va1 (or the voltage Vb2) and Va2 (or the voltage Vb1)

that are prevented as much as possible from being influenced by a temperature change can be respectively obtained by acquiring the voltage Va2 (or the voltage Vb1) immediately after the voltage Va1 (or the voltage Vb2) is acquired. As a result, the current I1 (or the current I2) flowing into the load Lo can be detected with a high accuracy.

The above described power source circuit 1 according to the first embodiment, power source circuit 6 according to the second embodiment, and power source circuit 7 according to the third embodiment are configured so that the abnormality determination unit 42 can determine a state of the power source circuit to be an abnormal state in a case where the current I1 (and the current I2) obtained by the control unit 41 is equal to or higher than the threshold value th1. However, these circuits may be configured so that an idling-stop can be prohibited in the case where the current I1 (and the current I2) obtained by the control unit 41 is equal to or higher than the threshold value th1. For example, the control unit 41 issues a notification for prohibiting an idling-stop to the higher-level control circuit in the case where the current I1 (and the current I2) is equal to or higher than the threshold value th1. Upon receipt of the notification for prohibiting the idling-stop, the higher-level control circuit prohibits an idling-stop operation.

The invention claimed is:

1. A power source circuit, comprising
a booster circuit including a booster switch, a coil provided between a battery and the booster switch, and a diode provided between the coil and a load;
a first bypass circuit including a first bypass switch connected to the booster circuit in parallel, and a first current detection circuit for detecting a voltage applied to a first shunt resistor provided between the first bypass switch and the load;
a control unit for acquiring a first detection value detected by the first current detection circuit when the first bypass switch is turned off, for also acquiring a second detection value detected by the first current detection circuit when the first bypass switch is turned on, and for obtaining an electric current flowing from the battery into the load via the first bypass switch on a basis of a difference between the second detection value and the first detection value, at normal times other than a restarting of an engine after being idling-stopped; and
a second bypass circuit including a second bypass switch connected to the first bypass circuit in parallel, wherein
the control unit, at normal times other than a restarting of an engine after being idling-stopped, acquires the first detection value detected by the first current detection circuit when the control unit turns on the second bypass switch while turning off the first bypass switch, also acquires the second detection value detected by the first current detection circuit when the control unit turns off the second bypass switch while turning on the first bypass switch, and obtains an electric current flowing from the battery into the load via the first bypass switch on the basis of the difference between the second detection value and the first detection value.

2. The power source circuit according to claim 1, further comprising
an abnormality determination unit for determining a state of the power source circuit to be an abnormal state in a case where the electric current obtained by the control unit is equal to or higher than a threshold value.

3. The power source circuit according to claim 1, wherein
the control unit prohibits an idling-stop when the obtained electric current is equal to or higher than a threshold value.

4. The power source circuit according to claim 1, wherein
the second bypass circuit includes a second current detection circuit for detecting a voltage applied to a second shunt resistor provided between the second bypass switch and the load, and
the control unit, at normal times other than the restarting of the engine after being idling-stopped, acquires a third detection value detected by the second current detection circuit when the control unit turns on the second bypass switch while turning off the first bypass switch, acquires a fourth detection value detected by the second current detection circuit when the control unit turns off the second bypass switch while turning on the first bypass switch, obtains an electric current flowing from the battery into the load via the second bypass switch on a basis of a difference between the third detection value and the fourth detection value, and determines whether the first current detection circuit or the second current detection circuit is faulty, on a basis of the electric current that is obtained on the basis of the difference between the second detection value and the first detection value, and the electric current that is obtained on the basis of the difference between the third detection value and the fourth detection value.

* * * * *